United States Patent
Ivan et al.

(10) Patent No.: US 9,647,691 B2
(45) Date of Patent: May 9, 2017

(54) APPARATUS AND METHOD FOR PROCESSING TRACE DATA STREAMS

(71) Applicants: Radu-Marian Ivan, Bucharest (RO); Razvan Lucian Ionescu, Bucharest (RO); Mihai Udvuleanu, Bucharest (RO); Ionut-Valentin Vicovan, Bucharest (RO)

(72) Inventors: Radu-Marian Ivan, Bucharest (RO); Razvan Lucian Ionescu, Bucharest (RO); Mihai Udvuleanu, Bucharest (RO); Ionut-Valentin Vicovan, Bucharest (RO)

(73) Assignee: NXP USA, INC., Austin, TX (US)

( * ) Notice: Subject to any disclaimer, the term of this patent is extended or adjusted under 35 U.S.C. 154(b) by 254 days.

(21) Appl. No.: 14/564,602

(22) Filed: Dec. 9, 2014

(65) Prior Publication Data
US 2016/0105200 A1    Apr. 14, 2016

(30) Foreign Application Priority Data
Oct. 8, 2014   (RO) .............................. A 2014 00753

(51) Int. Cl.
*H03M 13/15* (2006.01)
*H03M 13/00* (2006.01)
(Continued)

(52) U.S. Cl.
CPC ....... *H03M 13/156* (2013.01); *G06F 11/3636* (2013.01); *H04L 7/04* (2013.01); *H04L 7/08* (2013.01)

(58) Field of Classification Search
None
See application file for complete search history.

(56) References Cited

U.S. PATENT DOCUMENTS 7,743,279 B2 * 6/2010 Walker ............... G06F 11/3636
   712/227
8,001,428 B2 * 8/2011 Ashfield ............ G06F 11/3466
   714/18

(Continued)

FOREIGN PATENT DOCUMENTS

EP    2511787 A1    10/2012

OTHER PUBLICATIONS

Lin, Y., et al. "Performance Comparison of Path Matching Algorithms over Compressed Control Flow Traces", Proceedings of the 2005 Data Compression Conference, 1068-0313/05; Mar. 29-31, 2005; pp. 113-122.

*Primary Examiner* — Justin R Knapp

(57) ABSTRACT

An apparatus comprising: a lower-layer decoder configured to decode a data stream formatted according to a lower-layer protocol that interleaves portions of a first data stream and one or more additional data streams to produce separated data streams comprising the first data stream and separately the one or more additional data streams; and a higher-layer decoder configured to decode the first data stream formatted according to a higher-layer protocol to produce trace data, the higher-layer decoder comprising: synchronization logic configured to process the first data stream to detect a data pattern within the first data stream as a synchronization event; and decoding logic configured to use the synchronization event to synchronize decoding of the received first data stream to produce the trace data.

19 Claims, 3 Drawing Sheets

(51) Int. Cl.
*G06F 11/30* (2006.01)
*H04L 7/08* (2006.01)
*G06F 11/36* (2006.01)
*H04L 7/04* (2006.01)

(56) References Cited

U.S. PATENT DOCUMENTS

| | | | |
|---|---|---|---|
| 8,620,881 B2 | 12/2013 | Chamberlain et al. | |
| 8,713,370 B2* | 4/2014 | Millet | G06F 11/3636 |
| | | | 714/27 |
| 8,938,649 B2* | 1/2015 | Peck | G06F 11/3632 |
| | | | 714/45 |
| 9,026,861 B2* | 5/2015 | Peck | G06F 11/3632 |
| | | | 714/25 |
| 9,158,720 B2* | 10/2015 | Shirlen | G06F 13/36 |
| 2008/0163177 A1 | 7/2008 | Ivanova | |
| 2014/0359374 A1* | 12/2014 | Shirlen | G06F 11/3466 |
| | | | 714/45 |
| 2015/0127992 A1* | 5/2015 | Sankar | G06F 11/3003 |
| | | | 714/45 |
| 2015/0127993 A1* | 5/2015 | Sankar | G06F 11/3466 |
| | | | 714/45 |
| 2015/0127994 A1* | 5/2015 | Sankar | G06F 11/3636 |
| | | | 714/45 |
| 2016/0070634 A1* | 3/2016 | Shirlen | G06F 11/3495 |
| | | | 714/45 |

* cited by examiner

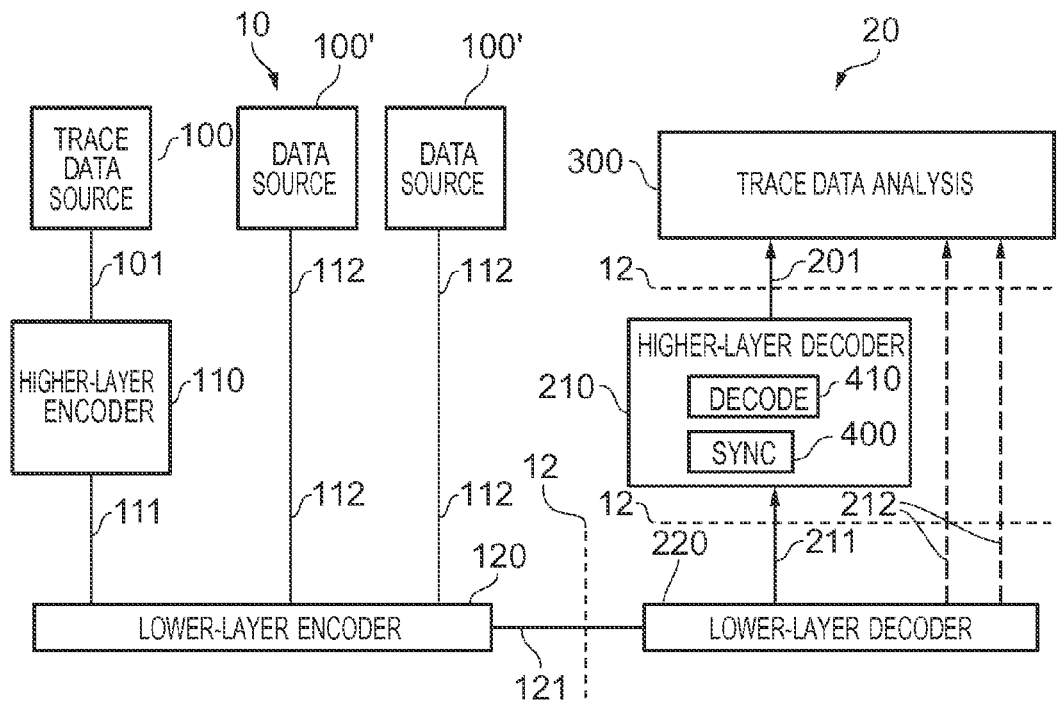
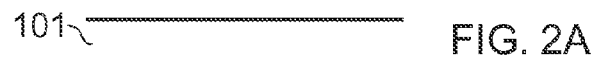
FIG. 2A
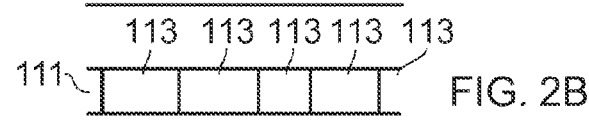
FIG. 2B
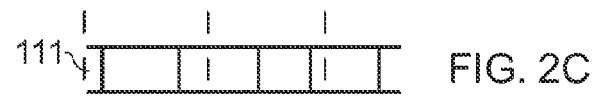
FIG. 2C
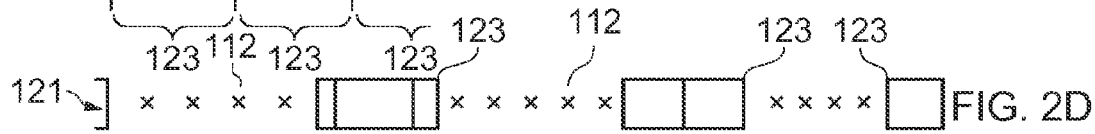
FIG. 2D
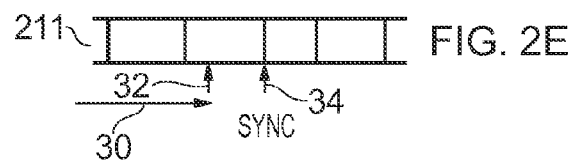
FIG. 2E
FIG. 2F

APPARATUS AND METHOD FOR PROCESSING TRACE DATA STREAMS

FIELD OF THE INVENTION

This invention relates to the field of data processing systems. More particularly, this invention relates to trace data streams of a data processing system.

BACKGROUND OF THE INVENTION

Some data processing systems comprise trace data generators that monitor the data processing operations taking place on a data processing apparatus and generate a trace data stream indicative of the monitored data processing operations. A trace data stream may, for example, indicate which instructions are being executed, and/or which data values are being manipulated and/or data values being read or written to particular memory locations.

The trace data stream may be output (possibly after on-chip storage) to a trace data analyzer. The analyzer may, for example, be a software diagnostic tool that assists a hardware designer or a programmer in debugging the data processing system.

System-on-chip (SoC) designs may be used for data processing systems that comprise multiple different data processing elements, each performing its own data processing operations in communication with other data processing elements. For example an integrated circuit (IC) may comprise one or more processor cores, a digital signal processor and a memory system. Each of these data processing elements may have its own trace data stream.

It may be desirable in data processing systems comprising a plurality of trace data sources to generate a combined data stream comprising trace data from one or more trace data sources.

SUMMARY OF THE INVENTION

The present invention provides a as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

FIG. 1 schematically shows an example of an embodiment of a system for transferring trace data from one or more trace data sources to a trace data analyzer;

FIG. 2A to 2F schematically shows an example of an embodiment of various data streams within the system;

DETAILED DESCRIPTION OF THE PREFERRED EMBODIMENTS

Figure 3:
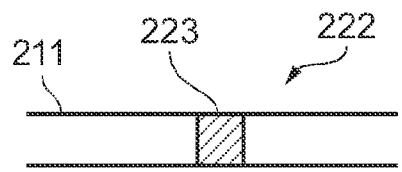
FIG. 3 schematically shows an example of an embodiment of a data pattern within the first (decode) data stream that is detected as a synchronisation event FIG. 4A schematically shows an example of an embodiment of a data pattern within the first (decode) data stream that is detected as a synchronisation event spread over multiple distinct data sequences.

Because the illustrated embodiments of the present invention may, for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

FIG. 1 schematically shows an example of a system for transferring trace data from one or more trace data sources 100 to a trace data analyzer 300. In this system at least some of the trace data produced by a trace data source 100 is double encoded according to a higher-layer protocol and also according to a lower-layer protocol. The reference to "higher" and "lower" in respect of the protocols refers to their ordering within the layers of a stack of protocols, that is, the higher-layer protocol is used for the initial encoding process and then the lower-layer protocol is used for the subsequent encoding and the lower-layer protocol is used for the initial decoding process and then the higher-layer protocol is used for the subsequent decoding.

In some, but not necessarily all examples, the lower-layer protocol may be a standardised protocol. One example of a standardised lower-layer protocol which may in some, but not necessarily all examples be used is the advanced microcontroller bus architecture (AMBA) and, in particular the advanced trace bus (ATB) or a subsequent evolution.

In some, but not necessarily all examples, the higher-level protocol may be a standardised protocol. One example of a standardised higher-layer protocol which may in some, but not necessarily all examples be used is the IEEE-ISTO 5001-2003 standard (Nexus) or a subsequent evolution.

The system illustrated in FIG. 1 enables the effective analysis of trace data when double encoding and subsequent double decoding using different protocols is performed.

In this example, the system comprises an encoding system 10 and a decoding system 20.

The encoding system 10 may, for example, be part of a data processing system. The data processing system may, for example, be embodied in hardware as an integrated circuit or as or part of a system on chip.

An external interface 12 may be used as an output port from the data processing system. Depending on the location of the external interface 12 relative to the stack of protocols of the decoding system 20, some, all or none of the decoding system 20 may be part of the data processing system.

In the figure, a trace data source 100 produces trace data 101. The trace data source 100 may be any suitable source of trace data. For example in some, but not necessarily all examples, it may be a processor core, a digital signal processor or a memory system. The figure also illustrates additional data sources 100'. In some, but not necessarily all examples, one or more of the data sources 100' may be a trace data source 100. In the Figure, two distinct data sources 100' are illustrated. It should, however, be appreciated that there may be a single data source 100' or any number of data sources 100'.

The trace data 101 provided by the trace data source 100 is received by the higher-layer encoder 110. The higher-layer encoder 110 is configured to encode the trace data 101 according to a higher-layer protocol. The encoding produces a first (encode) data stream 111 that is formatted according to the higher-layer protocol.

The first (encode) data stream 111 produced by the higher-layer encoder 110 and formatted according to the higher-layer protocol is provided as an input to a lower-layer encoder 120. The lower-layer encoder 120 also receives additional (encode) data streams 112 from each of the respective data sources 100'. Where an additional data source is a trace data source 100, the additional (encode) data stream 112 comprises trace data which may or may not be formatted according to a higher-level protocol which may or may not be the same higher-level protocol used by the higher-layer encoder 110. Thus, although in this example, a single higher-layer encoder 110 is illustrated, it should be appreciated that any one or more of the data stream inputs to the lower-layer encoder 120 may be provided from a respective higher-layer encoder 110.

The lower-layer encoder 120 is configured to perform encoding according to a lower-layer protocol that is different to the higher-layer protocol. The lower-layer protocol comprises interleaving portions of the received first (encode) data stream 111 formatted according to the higher-layer protocol and the additional (encode) data streams 112. The result of this encoding process is an encoded data stream 121 that is formatted according to the lower-layer protocol and interleaves portions of the first (encode) data stream 111 (formatted according to the higher-layer protocol) and the additional (encode) data streams 112. It will be appreciated that the encoding system 10 performs a hierarchical and ordered combination of encoding protocols. This will be reversed in the decoding system 20.

The decoding system 20 comprises a lower-layer decoder 220 that decodes the encoded data stream 121 according to the lower-layer protocol. The lower-layer decoder 220 de-interleaves the encoded data stream 121 to produce, as separate data streams, a first (decode) data stream 211 that corresponds to the first (encode) data stream 111 and additional (decode) data streams 212 that correspond to the respective additional (encode) data streams 112 input to the lower-layer encoder 120.

The first (decode) data stream 211 is formatted according to the higher-layer protocol but has been partitioned by the interleaving/de-interleaving of the lower-layer encoder 120 and lower-layer decoder 220. The first (decode) data stream 211 is received by the higher-layer decoder 210 which decodes the first (decode) data stream 211 according to the higher-layer protocol to produce (decode) trace data 201 that corresponds to the trace data 101 originally provided by the trace data source 100. The (decode) trace data 201 is provided to the trace data analyzer 300. If the additional (decode) data streams 212 produced by the lower-layer decoder 220 relate to trace data then they will also be provided to the trace data analyzer 300 after higher-level decoding where appropriate. The trace data analyzer 300 analyses the trace data.

The higher-layer decoder 210 is configured for intermittent or ad-hoc operation. That is, the higher-layer decoder 210 does not need to continuously operate and continuously decode the first (decode) data stream 211 to produce the (decode) trace data 201. The higher-layer decoder 210 is configured to enable the initiation of decoding of the first (decode) data stream 211 to produce the (decode) trace data 201 at a time after the beginning of the first (decode) data stream 211. For example the higher-layer decoder 210 may be used, in some but not necessarily all examples, at any arbitrary time to decode a portion of the first (decode) data stream 211 to produce a desired sample portion of the (decode) trace data 201. It will be appreciated that this may significantly reduce the demand for resources, particularly if the (decode) trace data 201 is stored in a memory of the data processing system.

It will be appreciated that the external interface 12 to the data processing system may be positioned at different layers within the system. For example, it may be positioned at the lower-layer between the lower-layer encoder 120 and the lower-layer decoder 220. For example, it may be positioned at the higher-layer between the lower-layer decoder 220 and the higher-layer decoder 210 or it may be positioned, for example between the higher-layer decoder 210 and the trace data analyzer 300 to provide an input to the trace analyzer 300. Alternatively, it may be positioned above the trace data analyzer 300 to provide an output to the trace analyzer 300.

The higher-layer decoder 210 comprises synchronisation logic 400 and decode logic 410. The synchronisation logic 210 is configured to process the first (decode) data stream 211 to detect a data pattern within the first (decode) data stream 211 as a synchronisation event. That is, a data pattern is detected that has meaning in relation to the higher-layer protocol and, in particular, to enabling synchronisation of the decoder 410 with the first (decode) data stream 211 that is formatted according to the higher-layer protocol.

The decoding logic 410 uses the synchronisation event to synchronise decoding of the received first (decode) data stream 211 to produce trace data 201.

FIGS. 2A to 2F schematically illustrate various data streams within the system. FIG. 2A illustrates the original trace data stream 101. The temporal order of data in the trace data stream 101 has significance.

FIG. 2B illustrates the partitioning of the trace data 101 into higher-layer protocol elements 113 to produce the first (encode) data stream 111 formatted according to the higher-layer protocol.

FIG. 2C schematically illustrates the partitioning of the first (encode) data stream 111 formatted according to the higher-layer protocol into lower-layer protocol elements 123 defined by the lower-layer protocol. The partitioning of the first (encode) data stream 111 to produce the lower-layer protocol elements 123 may be controlled by the lower-layer encoder 120. In this example there may be no synchronisation between the higher-layer protocol elements 113 and the lower-layer protocol elements 123. Consequently, there is no necessity for the boundaries of the lower-layer protocol elements 123 to have any particular relationship to the boundaries of the higher-layer protocol elements 113.

FIG. 2D schematically illustrates the encoded data stream 121 in which the first (encode) data stream 111 formatted according to the higher-layer protocol has been interleaved with additional (encode) data streams 112 to produce the encoded data stream 121 that has been formatted according to the lower-layer protocol and comprises interleaved portions of the first (encode) data stream 111 and the additional (encode) data streams 112.

FIG. 2E illustrates the first (decode) data stream 211 as it would appear after decoding according to the lower-layer protocol at the lower-layer decoder 220. In this example the first (decode) data stream 211 is formatted according to the higher-layer protocol and therefore comprises higher-layer protocol elements 113. However, for delivery it was partitioned into the lower-layer protocol elements 123.

FIG. 2E schematically illustrates a start time 32 for starting the higher-layer decoder 210 to decode the first (decode) data stream 211. It should be appreciated that although the first (decode) data stream 211 is comprised of higher-layer protocol elements 113 in series, the decoder 210 has no knowledge of how the boundaries of the higher-layer protocol elements 113 relate to its time reference. It is therefore necessary to perform synchronisation so that there is alignment between the time reference of the higher-layer decoder 210 and the formatting of the first (decode) data stream 211 such that the higher-layer decoder 210 is aware of where the boundaries of the higher-layer protocol elements 113 occur.

In FIG. 2E, the higher-layer decoder 210 is started at an arbitrary time 32 which has an arbitrary offset 30 from the start of the first (decode) data stream 211. The figure illustrates that a synchronisation event 34 enables synchronisation to the higher-layer protocol elements 113.

As previously described, the synchronisation logic 400 processes the first (decode) data stream 211 to detect a data pattern within the first (decode) data stream 211 as a synchronisation event 34. The decoding logic 410 uses the synchronisation event 34 to synchronise decoding of the received first (decode) data stream 211 to produce trace data 201. The produced trace data 201 is showed in FIG. 2F. Although in this example, the trace data 201 starts from the synchronization event 34, it will be appreciated that once synchronization has occurred it is possible to decode a stored portion of the first (decode) data stream 211 that precedes the synchronization event 34.

Figure 4A:
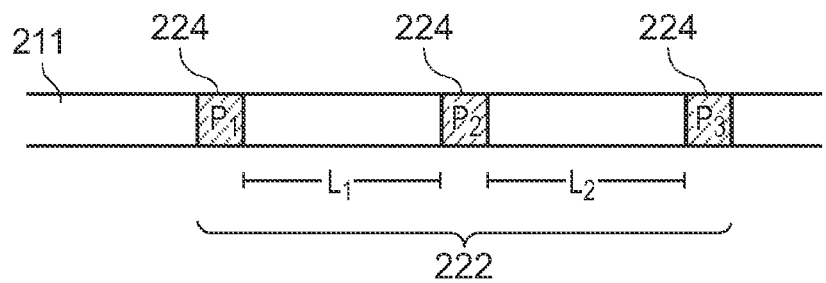
FIG. 4B schematically shows an example of an embodiment of a pattern of time separated data sequences (headers 114) that is allowed according to the higher-layer protocol.

The data pattern within the first (decode) data stream 211 that is detected as a synchronisation event 34 may be a bit pattern 222 spread over one or more distinct data sequences, for example as illustrated in FIGS. 3 and 4A.

Figure 6:
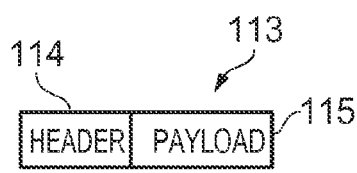
FIG. 6 schematically shows an example of an embodiment of a higher-layer protocol element.

In the example of FIG. 3, bit pattern 222 is a single contiguous bit sequence. This bit sequence is a reserved bit sequence 223 that is unique and is used only for the purposes of detection of a synchronisation event 34. The bit pattern 222 defined by the reserved bit sequence 223 has a predetermined relationship to the higher-layer protocol element 113 comprising the reserved sequence 223. As illustrated in FIG. 6, the higher-layer protocol element 113 may be a message 113 comprising a header 114 and a payload 115 and the reserved sequence 223 may correspond to the header 114 or a part of the header 114.

The reserved sequence 223 may in some, but not necessarily all examples, be a watchpoint. Reserved sequence 223 may, for example, be introduced when the trace data source 100 is a processor core or digital signal processor or other data processing element that can controllably modify the trace data stream 101. The reserved sequence 223 may be introduced into the trace data stream 101 in response to a trigger event. A trigger event may for example be produced periodically by a timer. A trigger event may, for example, occur when a specific instruction is identified in the trace data 101. The specific instruction may, for example, be user configurable. A comparator may be used to determine when the specific instruction is present in the trace data 101. A trigger event may, for example, occur when a specific memory space is used. The specific memory space and/or the access type (read/write) may, for example, be user configurable. A comparator may be used to determine when the specific memory space is present in the trace data 101. A trigger event may, for example, occur as a consequence of performance monitoring, for example, when a performance related threshold is exceeded.

FIG. 4A illustrates a first (decode) data stream 211 in which the bit pattern 222 that is detected for the synchronisation event 34 is spread over more than one distinctive data sequence. In this example, the bit pattern 222 comprises in series, but not contiguous, multiple separated bit pattern portions 224. Each of the multiple bit pattern portions 224 is a single contiguous bit sequence but is separated by other bits from the next bit pattern portion 224 in the series.

In the example of FIG. 4A, three bit pattern portions 224 are in series—a first bit pattern portion $P_1$, followed by a second bit pattern portion $P_2$, followed by a third bit pattern portion $P_3$. The first bit pattern portion $P_1$ is separated from the second bit pattern portion $P_2$ by contiguous bits that create a separation of length $L_1$. The second bit pattern portion $P_2$ is separated from the third bit pattern portion $P_3$ by contiguous bits that create a separation of length $L_2$. It should be appreciated that this bit pattern 222 is merely an arbitrary example of a suitable bit pattern 222.

Although in this example the first bit pattern portion $P_1$, second bit pattern portion $P_2$ and the third bit pattern portion $P_3$ are referred to using the same reference 214, it should be appreciated that they may be the same sequences of bits or different sequences of bits.

The bit pattern 222 may, for example be defined in relation to only the identity of the multiple bit pattern portions 224 (combination). Alternatively, the bit pattern 222 may, for example be defined in relation to only the identity of the multiple bit pattern portions 224 and their order (permutation). Alternatively, the bit pattern 222 may, for example be defined in relation to the identity of the multiple bit pattern portions 224, their order and their separation lengths $L_n$.

For example, the first (decode) data stream 211 may comprise a concatenated series of messages 113 where each message 113 corresponds to the higher-layer protocol element 113. Each message 113 may comprise a header 114 and a payload 115, for example as illustrated in FIG. 6. A particular series of messages 113 may reproduce the bit pattern 222 comprising bit pattern portions 224 spread over the particular series of messages 113. Each of the bit pattern portions 224 may correspond to a header 114 of a particular message and the data separating adjacent pattern portions 224 may correspond to the payload 115 headed by the preceding bit pattern portion 224. In some embodiments, but not necessarily all embodiments, the header 114 of a message 113 may define the length of the payload 115. In such circumstances, the data separation length $L_n$ between the adjacent bit portions (headers) may be used as part of the bit pattern 222. The bit pattern 222 is thus a pattern of time-separated data sequences 224 corresponding to a pattern of time separated data sequences (headers) allowed according to the higher-layer protocol.

Figure 4B:
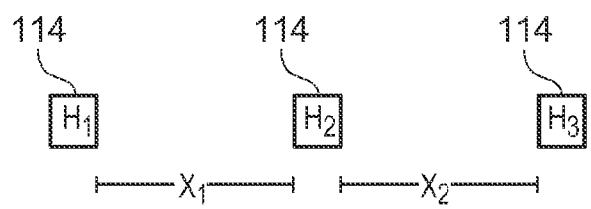

FIG. 4B illustrates an example of a pattern of time separated data sequences (headers 114) that is allowed according to the higher-layer protocol. Each message 113 comprises a header 114 and a payload 115 of length X. The header 114 of a message 113 defines the length X of the payload 115. Correspondence between a pattern of time separated data sequences 224 in the first (decode) data stream 211 (FIG. 4A) and a pattern of time separated data sequences allowed according to the higher-layer protocol (FIG. 4) occurs, for example, when there is correspondence:

between the first bit pattern portion $P_1$ and the header $H_1$ of the first message;
(optionally) between the length $L_1$ of the first separation (between the first bit pattern portion $P_1$ and the second bit pattern portion $P_2$) and the length of the payload portion $X_1$ of the first message;
between the second bit pattern portion $P_2$ and the header $H_2$ of the second message;
(optionally) between the length $L_2$ of the second separation (between the second bit pattern portion $P_2$ and the third bit pattern portion $P_3$) and the length of the payload portion $X_2$ of the second message; and
between the third bit pattern portion $P_3$ and the header $H_3$ of the third message;

It will be appreciated that the higher-layer protocol may define a very large number of allowed permutations and combinations of headers 114. Each one of these different permutations or combinations of headers in the first (decode) data stream 211 may additionally have different probabilities of occurrence. The synchronisation logic 400 may perform a search of received first (decode) data stream 211 to find an expected pattern of headers 114 as a combination or permutation (ordered combination). For example the synchronisation logic 400 may search through the different permutations or combinations of headers allowed by the higher-layer protocol starting with those permutations and combinations that have the highest likelihood of occurrence.

The search may additionally take into account separation $L_n$ between bit pattern portion $P_n$ and bit pattern portion $P_{n+1}$ and the length of the payload portion $X_2$ defined by the header 114 corresponding to bit pattern portion $P_n$.

In the examples of FIGS. 3 and 4A, the data pattern within the first (decode) data stream 211 that is detected as a synchronisation event 34 is a bit pattern 222 spread over one or more distinct data sequences. In other examples, the data pattern within the first (decode) data stream 211 that is detected as a synchronisation event 34 may correspond to a series of successfully decoded consecutive messages 113. In this example, the synchronization logic 400 assumes a putative synchronisation (timing alignment) between the decoding logic 410 and the first (decode) data stream 211. A putative decoding operation is then performed:
(i) If the assumed putative synchronisation (timing alignment) between the decoding logic 410 and the first (decode) data stream 211 results in the successful decoding by the decoding logic 410 of a threshold number of consecutive messages 113, then the putative synchronisation (timing alignment) between the decoding logic 410 and the first (decode) data stream 211 is set as the actual synchronization used by the decoding logic 410 for decoding the first (decode) data stream 211.
(ii) If the assumed putative synchronisation (timing alignment) between the decoding logic 410 and the first (decode) data stream 211 does not result in the successful decoding of a threshold number of consecutive messages 113, then the putative synchronisation (timing alignment) between the decoding logic 410 and the first (decode) data stream 211 is adapted and the putative decoding operation is repeated.

Figure 5:
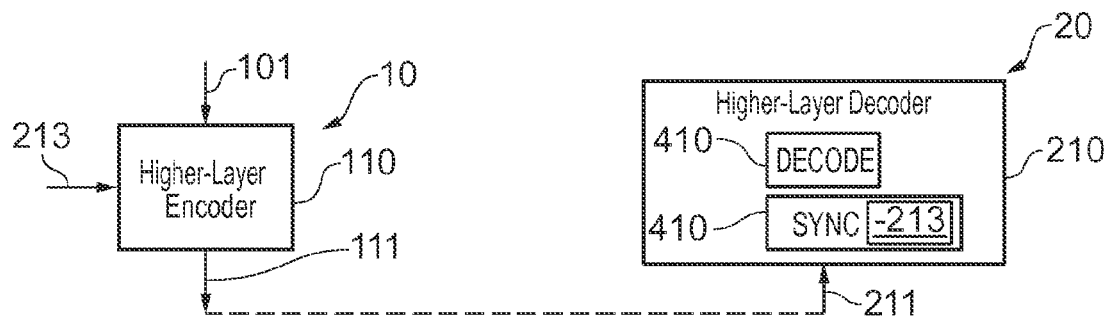
FIG. 5 schematically shows an example of an embodiment of a where a reserved sequence is added to the first (decode) data stream.

FIG. 5 illustrates an example of some of the components of FIG. 1 where a reserved sequence 223 is added to the first (decode) data stream 211. The reserved sequence 223 will be added, at the encoding system 10, by the higher-layer encoder 110 into the first (encode) data stream 111 that is formatted according to the higher-layer protocol. At the decoding system 20, the higher-layer decoder 400 and in particular the synchronisation logic 400, will use the reserved sequence 223 to identify when the reserved sequence 223 occurs within the first (decode) data stream 211 provided by the lower-layer decoder 220.

FIG. 6 illustrates an example of a higher-layer protocol element 113. In this example, the higher-layer protocol element 113 is a message 113 that comprises a header 114 and a payload or packet 115.

In some examples, the header may be a bit pattern that encodes, via the higher-layer protocol, a code that is used to identify a number and/or size of the payload 115. For example, the payload 115 may be of variable length and the header may provide a code that indicates, via a look-up table, the length of the payload 115. The header 114 therefore provides an indication of where the next higher-layer protocol element 113 (a message 113) begins.

According to some but not necessarily all examples, the higher-layer protocol may be defined according to the IEEE-ISTO 5001-2003 standard (and its subsequent evolutions). This standard, commonly referred to as the nexus standard, provides a messaging protocol used in the debugging of embedded systems. According to this protocol, the header is a six bit transfer code.

The decoding logic 410 is configured to decode a message header 114 before a data payload 115 associated with the message header in the same message 113.

Figure 7:
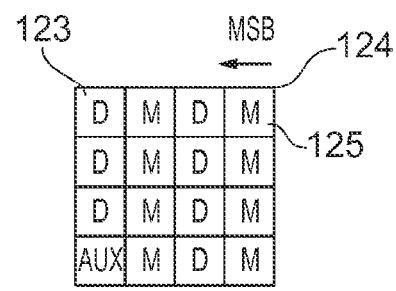
FIG. 7 schematically shows an example of an embodiment of a lower-layer protocol element.

FIG. 7 illustrates an example of a lower-layer protocol element 123. In this example, the lower-layer protocol elements 123 are arranged in an ordered frame 124. Each lower-layer protocol element 123 within the frame 124 is defined by the lower-layer protocol and different ones of the lower-layer protocol elements 123 may relate to different sources that are interleaved within the frame 124.

In some but not necessarily all examples, the lower-layer protocol may be the advanced microcontroller bus architecture (AMBA)—advanced trace bus (ATB). This is a standardised protocol used for the transfer of data and in particular trace data within a data processing system.

For example, the frame 124 may comprises 16 lower-layer protocol elements 123. Each lower-layer protocol element 123 comprises a byte of data. Starting with the first byte (top row, rightmost column), alternate bytes within the trace data frame are mixed bytes M. Starting with the second byte (top row, second rightmost column), alternate bytes within the trace data frame are data bytes D. However, the last byte is an auxiliary byte Aux.

Data bytes D comprise a byte of data. Mixed bytes M comprise a bit flag that indicates whether a trace data source identifier ID or trace data is stored within that byte.

If the bit flag indicates that the mixed byte M stores trace data then the seven least significant bits of the source trace data are present in the mixed byte M and the most significant bit of the source trace data is in a corresponding bit of the auxiliary byte Aux.

It should be appreciated that examples of the invention may be implemented without modification to the lower-level protocol or modification of the lower-layer encoder 120 or lower-layer decoder 220.

Figure 8:
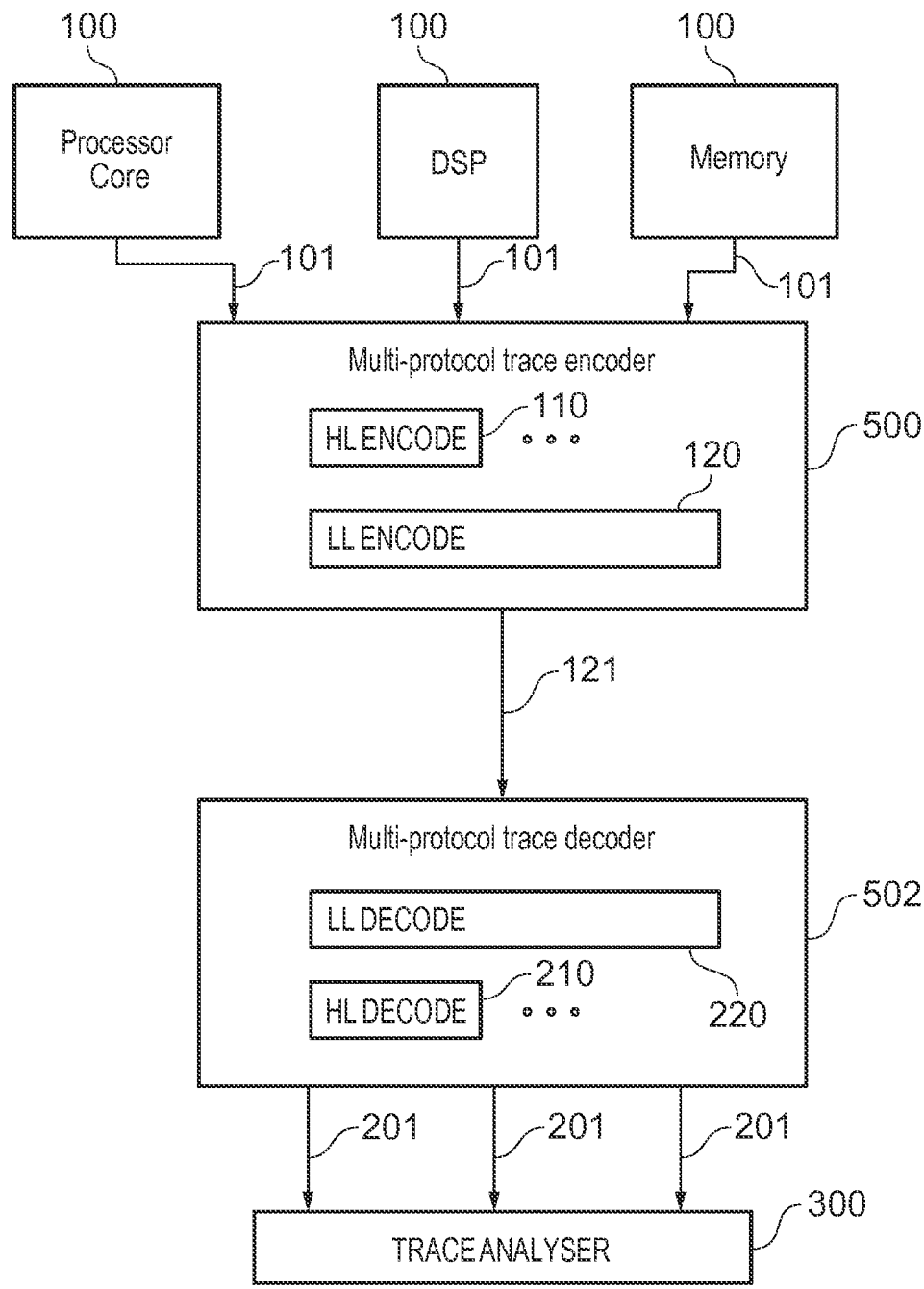
FIG. 8 schematically shows an example of an embodiment of a system on chip.

FIG. 8 illustrates an example of a system on chip corresponding to the system illustrated in FIG. 1. In this example, the trace data source 100 is a processor core. Additional trace data sources 100 are also provided including a digital signal processor and a memory system.

A multi-protocol trace encoder 500 encodes the trace data 101 from the trace data sources 100. At least one of the trace data sources will be encoded using a higher-layer encoder 110 and a lower-layer encoder 120. Some or none of the trace data 101 from the trace data sources 100 may be encoded using only the lower-layer encoder 120. The encoded data stream 121 produced by the multi-protocol trace encoder 500 is then provided to a multi-protocol trace decoder 502. The multi-protocol trace decoder 502 performs the reverse operations of the multi-protocol trace encoder 500 to recover the trace data 101 originally input to the multi-protocol trace encoder 500. At least one of the recovered (decode) trace data streams 201 output by the multi-protocol trace decoder 502 are produced by double decoding—first by the lower-layer decoder 220 and then by the higher-layer decoder 210. As previously described, the higher-layer decoder 210 comprises synchronisation logic 400 configured to process the first (encode) data stream 211 provided by the lower-layer decoder 220 to detect a bit pattern within the first (encode) data stream as a synchronisation event 34; and decoding logic 410 configured to use the synchronisation event 34 to synchronise decoding of the received first (decode) data stream 211. The recovered trace data 201 is provided to the trace analyzer 300 for analysis.

The above described functions of the higher-layer encoder 110 and/or the lower-layer encoder 120 and/or the lower-layer decoder 220 and/or the higher-layer decoder and/pr the trace data analyzer 300 can be performed at least in part using hardware and/or computer software.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims and that the examples are merely illustrative.

The connections may be a type of connection suitable to transfer signals from or to the respective nodes, units or devices, for example via intermediate devices. Accordingly, unless implied or stated otherwise the connections may for example be direct connections or indirect connections.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIGS. 1 and 8 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10, 20 are circuitry located on a single integrated circuit or within a same device. Alternatively, system 10 and/or system 20 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, Also, devices functionally forming separate devices may be integrated in a single physical device. For example, However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An apparatus comprising:
   a lower-layer decoder configured to decode a data stream formatted according to a lower-layer protocol that interleaves portions of a first data stream and one or more additional data streams to produce separated data streams comprising the first data stream and separately the one or more additional data streams; and
   a higher-layer decoder configured to decode a first data stream formatted according to a higher-layer protocol to produce trace data, the higher-layer decoder comprising:
      synchronisation logic configured to process the first data stream to detect a data pattern within the first data stream as a synchronisation event; and
      decoding logic configured to use the synchronisation event to synchronise decoding of the received first data stream to produce the trace data.

2. The apparatus as claimed in claim 1, wherein the data pattern is a bit pattern spread over one or more distinct data sequences.

3. The apparatus as claimed in claim 2, wherein the bit pattern is a reserved bit sequence.

4. The apparatus as claimed in claim 3, wherein the reserved bit sequence is a unique message header.

5. The apparatus as claimed in claim 1, wherein the data pattern is a pattern of time-separated data sequences corresponding to a pattern of time separated data sequences allowed according to the higher-layer protocol.

6. The apparatus as claimed in claim 5, wherein the pattern of time-separated data sequences allowed according to the higher-layer protocol is an allowed pattern of message headers.

7. The apparatus as claimed in claim 1, wherein the synchronisation logic comprises search logic configured to search the first data stream to detect the data pattern.

8. The apparatus as claimed in claim 1, wherein the higher-layer decoder is configured to initiate decoding of the first data stream at any arbitrary point within the first data stream.

9. The apparatus as claimed in claim 1, wherein the first data stream comprises a series of messages, wherein the synchronisation event has a predetermined relationship to a boundary of a message.

10. The apparatus as claimed in claim 1, wherein the first data stream comprises a series of messages, wherein the synchronisation event determines the position of at least a first message header, wherein the decoding logic is configured to decode a message header before a data packet associated with the message header.

11. The apparatus as claimed in claim 1, wherein the lower-level protocol is defined by the advanced microcontroller bus architecture specification.

12. The apparatus as claimed in claim 1, wherein the higher-layer protocol formats the data stream in higher-layer protocol elements and the lower-layer protocol formats the first data stream in lower-layer protocol elements and wherein the boundaries of the higher-layer protocol elements and the lower-layer protocol elements are not aligned.

13. The apparatus as claimed in claim 1, wherein the first data stream formatted according to the higher-layer protocol comprises a series of messages, wherein each message comprises a header and a packet and wherein the header identifies, according to the higher-layer protocol, the packet length.

14. The apparatus as claimed in claim 13, wherein the header of a message of the first data stream provides an instruction, according to the higher-layer protocol, as to a location of a next subsequent header in the data stream.

15. The apparatus as claimed in claim 1, configured as or part of a system on a chip.

16. A method comprising:
   decoding a received data stream formatted according to a lower-layer protocol that interleaves portions of a first data stream and one or more additional data streams to produce de-interleaved data streams comprising the first data stream and the one or more additional data streams; and
   decoding, using decoding logic, the first data stream formatted according to a higher-layer protocol to produce trace data by
      processing the first data stream using synchronization logic to detect a data pattern within the first data stream as a synchronisation event; and
      using the synchronisation event to synchronise decoding of the received first data stream to produce the trace data.

17. An apparatus comprising means for performing the method of claim 16.

18. A computer program that when executed by a processor causes the performance of the method of claim 16.

19. An apparatus comprising:
   a higher-layer encoder configured to receive trace data and produce a first data stream formatted according to a higher-layer protocol, and wherein the higher-layer encoder is configured to add a reserved data sequence to the first data stream in response to trigger events configured by a user; and
   a lower-layer encoder configured to receive the first data stream formatted according to the higher-layer protocol and one or more additional data streams and to produce an encoded data stream formatted according to a lower-layer protocol that interleaves portions of the first data stream and the one or more additional data streams.

* * * * *